United States Patent
Putman et al.

(10) Patent No.: US 10,173,246 B1
(45) Date of Patent: Jan. 8, 2019

(54) SYSTEMS, APPARATUS, AND METHODS FOR SORTING COMPONENTS USING ILLUMINATION

(71) Applicant: Nanotronics Imaging, Inc., Cuyahoga Falls, OH (US)

(72) Inventors: John B. Putman, Celebration, FL (US); Jonathan Yancey, Washington, PA (US); Justin Stanwix, New York, NY (US)

(73) Assignee: NANOTRONICS IMAGING, INC., Cuyahoga Falls, OH (US)

(*) Notice: Subject to any disclaimer, the term of this patent is extended or adjusted under 35 U.S.C. 154(b) by 0 days.

(21) Appl. No.: 15/992,985

(22) Filed: May 30, 2018

(51) Int. Cl.
*G01R 31/28* (2006.01)
*B07C 7/04* (2006.01)
*B07C 7/00* (2006.01)

(52) U.S. Cl.
CPC .............. *B07C 7/04* (2013.01); *B07C 7/005* (2013.01); *G01R 31/2808* (2013.01); *G01R 31/2865* (2013.01)

(58) Field of Classification Search
CPC .. B07C 5/02; B07C 5/342; B07C 5/38; B07C 7/04; G01R 31/2808; G01R 31/2851; G01R 31/2865; G01R 31/2868
USPC ........................................................ 209/573
See application file for complete search history.

(56) References Cited

U.S. PATENT DOCUMENTS

| | | | | |
|---|---|---|---|---|
| 3,584,741 A * | 6/1971 | Schirmer | ................ | B07C 5/344 209/559 |
| 5,177,437 A * | 1/1993 | Henley | ................ | G01R 31/308 324/73.1 |
| 6,625,558 B1 * | 9/2003 | Van Ausdall | ........ | G01N 21/956 209/573 |
| 6,985,219 B2 * | 1/2006 | Wilsher | ............... | G01R 31/311 324/754.23 |
| 7,355,386 B2 * | 4/2008 | Siade | .................... | H01L 21/681 324/757.04 |
| 7,450,245 B2 * | 11/2008 | Woods | ................. | G01R 31/308 356/369 |
| 7,525,593 B2 * | 4/2009 | Ichikawa | ............... | G01D 5/347 348/187 |
| 7,586,608 B1 * | 9/2009 | Gunn, III | ........... | G02B 6/12007 250/559.4 |
| 8,742,782 B2 * | 6/2014 | Ouyang | ........... | G01R 31/31728 324/750.3 |
| 8,907,696 B2 * | 12/2014 | Masuda | .......... | G01R 31/31917 324/750.23 |
| 9,094,135 B2 * | 7/2015 | Pelley | .................. | H04B 10/801 |
| 9,217,855 B1 * | 12/2015 | Clawges | ............ | G02B 21/0016 |
| 9,261,556 B2 * | 2/2016 | McShane | ............. | G01R 31/275 |

* cited by examiner

*Primary Examiner* — Joseph C Rodriguez
(74) *Attorney, Agent, or Firm* — Renner Kenner Greive Bobak Taylor & Weber

(57) ABSTRACT

An illumination apparatus, method and system to facilitate manual sorting of components. The illumination apparatus can include an array of lights and a component holder receptacle configured to receive a component holder retaining components. The illumination apparatus can further include a control module configured to receive information identifying components for sorting and location information for locating the one or more components on the component holder, and to selectively control activation of individual lights of the array of lights to illuminate the one or more components.

22 Claims, 11 Drawing Sheets

SYSTEMS, APPARATUS, AND METHODS FOR SORTING COMPONENTS USING ILLUMINATION

TECHNICAL FIELD

The present disclosure relates to systems, apparatus, and methods for sorting components after inspection. The disclosure is particularly applicable to wafer dicing and the identification of dies for sorting, but is not limited to such applications.

BACKGROUND

In manufacturing processes employing photolithography or similar methods, substrates (e.g., wafers) can vary in size, for example, from 25 mm to 300 mm in diameter. The microscopic components that are manufactured on a substrate can likewise vary in size from a few hundred microns or smaller, to a few centimeters, and a single substrate can have dozens, hundreds or thousands of components. These components can include, for example, transistors, resistors, capacitors, integrated circuits, microchips, diamonds, etc. After a substrate is processed, the substrate is diced to separate the components from the substrate. The diced components are typically mounted as part of a component holder, as shown, for example in FIG. 1 and designated by the numeral 10. Component holder 10 includes components 12 on an adhesive support 14 surrounded by a thin frame 16. A hexagonal frame is shown, but differently shaped component holders can be used, and other means to hold the components to the holder can be employed (e.g., vacuum).

Following dicing, the components on component holder 10 can be inspected by an inspection system to identify components that deviate from the expected design beyond a certain tolerance, or components that fail an inspection metric defined by an operator. Components can also be inspected for other purposes, for example, to identify components that meet certain physical criteria (e.g., color, size, weight), performance criteria (electrical conductivity, resistivity, tensile strength or compressive strength) or any other criteria defined by an operator.

Once the components have been identified by the inspection system, it is necessary to physically locate those components on the component holder, using location or other identifying information, and to separate them out for removal, packaging and/or further processing.

While there exists ink dot mechanisms and pick and place equipment for locating the identified components on component holder 10, this equipment can be very expensive to purchase and operate. Therefore, many manufacturers choose not to invest in such equipment and instead employ human operators to manually sort identified components. However, because of the size of the components it can be challenging to find the locations of the physical components on the component holder.

Accordingly, there is a need in the art for new apparatus and methods for facilitating manual sorting of components on a component holder.

SUMMARY

In accordance with some embodiments, systems, apparatus and methods for sorting components using illumination are provided. In some embodiments, an illumination apparatus is provided, the illumination apparatus comprising: an array of lights; a component holder receptacle configured to receive a component holder having components thereon; and a control module configured to: receive information about one or more components on the component holder, the information including at least one of identification of one or more components for sorting and location information for locating the one or more components on the component holder; and selectively control activation of individual lights of the array of lights to illuminate the one or more components.

In some embodiments, an illumination system is provided, the illumination system comprising: an illumination apparatus comprising: an array of lights and a component holder receptacle configured to hold a component holder having components thereon; an inspection system configured to generate component information about one or more components on the component holder, the component information including at least one of identification of one or more components for sorting and location information for locating the one or more components on the component holder; and a control module configured to receive the component information and activate one or more lights of the array of lights to illuminate at least a portion of the one or more components identified for sorting on the component holder.

In some embodiments, a method for sorting components on a component holder is provided, the method comprising: receiving, by an illumination apparatus, information about one or more components on a component holder, the information including at least one of identification of the one or more components identified for sorting and location information for locating the one or more components on the component holder, wherein the illumination apparatus comprises: an array of lights; a component holder receptacle configured to receive the component holder; and a control module configured to selectively control illumination of individual lights of the array of lights; positioning the component holder in the component holder receptacle; and selectively activating, by the control module, one or more individual lights of the array of lights to illuminate the one or more of the components identified to be sorted.

In some embodiments, the location information is based on one or more reference points used by an inspection system to identify the one or more components and used by the illumination apparatus to assign the individual lights of the array of lights to illuminate the one or more components.

In some embodiments, at least two components are identified for sorting based on different criteria and the control module is configured to activate the lights in different colors to reflect the different sorting criteria.

In some embodiments, the illumination apparatus further comprises a frame surrounding a light transmissive surface, wherein the array of lights and the component holder receptacle are positioned at opposite sides of the light transmissive surface.

In some embodiments, the illumination apparatus further comprises at least one reference point configured to interact with at least one reference point on a component holder, when a component holder is placed in the component holder receptacle.

In some embodiments, the control module is configured to control the selective illumination based on the interaction of the at least one reference point on the support and the at least one reference point on the component holder, when a component holder is placed in the component holder receptacle.

In some embodiments, the control module is configured to calculate the area of illumination projected by one or more of the lights of the array of lights on or below the component holder, when the component holder is placed in the component holder receptacle, and to control the selective illumination based on the calculated area of illumination.

In some embodiments, the illumination apparatus further comprises at least one reference point, wherein the control module is configured to calculate the area of illumination based on the reference point.

In some embodiments, the control module is further configured to control one or more settings, communications, operations and calculations performed by or between components of the illumination apparatus.

In some embodiments, the inspection system generates the location information based on the at least one reference point on the component holder.

In some embodiments, each light of the array of lights is not assigned to more than one component on the component holder.

DETAILED DESCRIPTION

The present disclosure provides systems, apparatus, and methods to facilitate manual sorting of components after inspection, which can include microscopic inspection or inspection of properties by other analytic tools such as die probes. Inspection refers to scanning, imaging, analyzing, measuring and any other suitable review of a specimen using a microscope or other analytic tool. More specifically, an inspection system can identify components on a component holder that: deviate from the expected design beyond a certain tolerance, meet or fail an inspection metric defined by an operator, and/or meet certain physical criteria (e.g., color, size, weight), performance criteria (electrical conductivity, resistivity, tensile strength or compressive strength) and/or any other suitable criteria defined by an operator. A disclosed illumination apparatus can receive information about the identified components and illuminate the identified components on the component holder as described herein. The selective illumination allows an operator to readily locate identified components on a component holder.

Figure 2A:
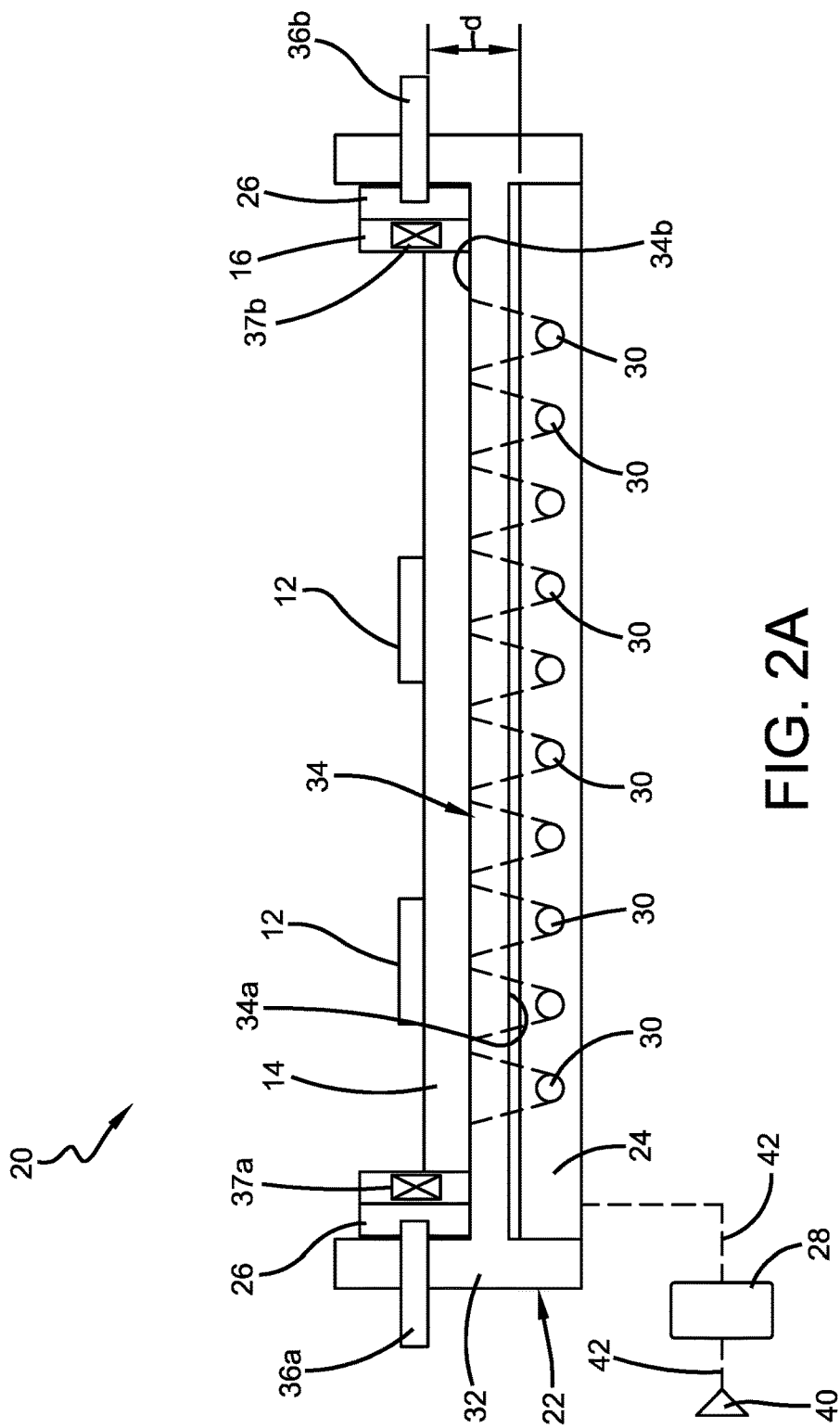
FIG. 2A is a side cross sectional view of an example illumination apparatus having a component holder therein, in accordance with some embodiments of the disclosed subject matter.
Figure 2B:
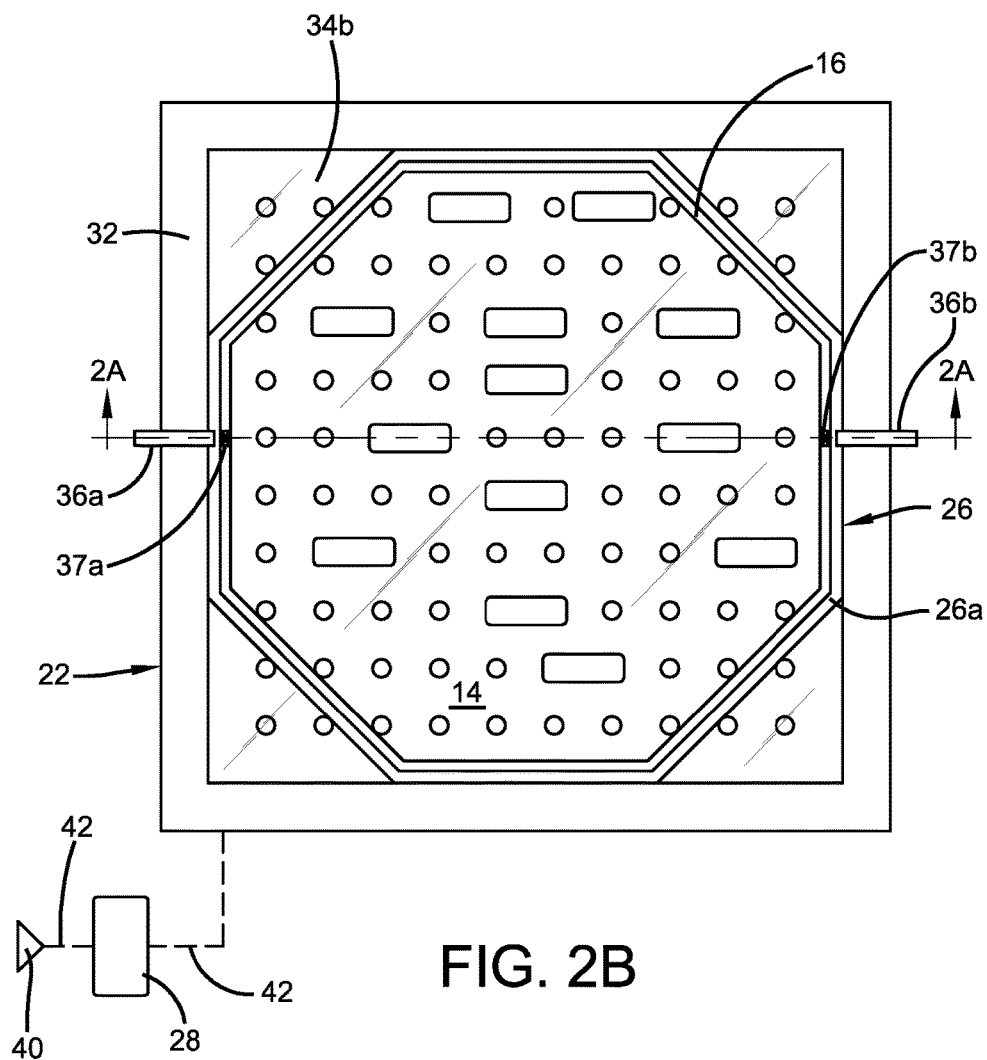
FIG. 2B is a top plan view of FIG. 2A, in accordance with some embodiments of the disclosed subject matter.
Figure 9:
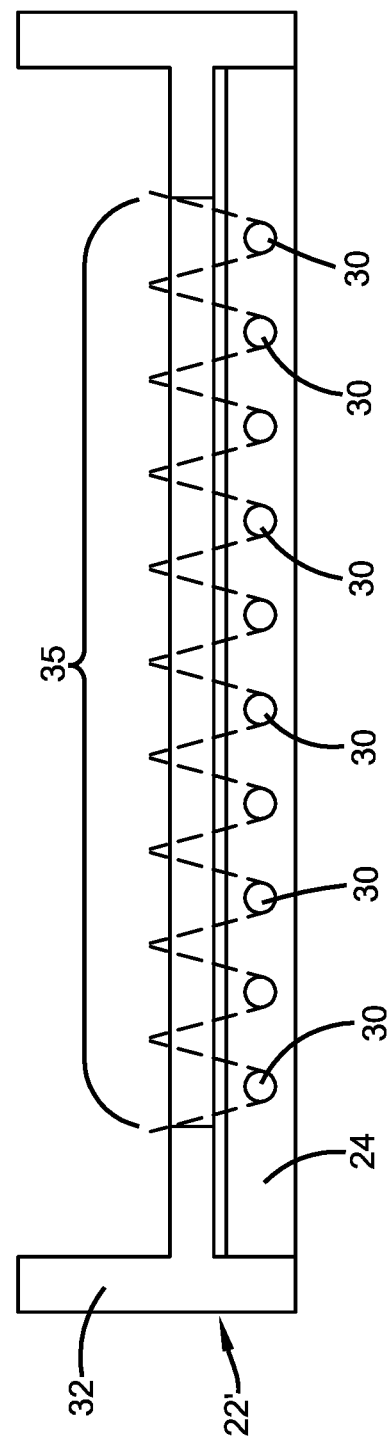
FIG. 9 is a cross section similar to FIG. 2A, but showing only relevant parts necessary to convey an example illumination apparatus with a single aperture, instead of a light transmissive surface, in accordance with some embodiments of the disclosed subject matter.

FIGS. 2A (cross sectional view) and 2B (top view) illustrate an example illumination apparatus 20 that can facilitate manual sorting according to some embodiments of the disclosed subject matter. Illumination apparatus 20 includes a support 22, a light array 24, a component holder receptacle 26, and a control module 28 comprising hardware, software, and/or firmware for controlling function of illumination apparatus 20. In the example shown in FIG. 2A, support 22 includes a frame 32 surrounding a light transmissive surface 34. Light array 24 includes a plurality of lights 30 positioned at a light source side 34a of light transmissive surface 34. In some embodiments, light transmissive surface 34 can be composed of any suitable transparent or translucent material (e.g., glass, plastic, cloth, etc.), allowing lights 30 to shine through to components 12 on component holder 10 that is placed on or above component side 34b. As shown, component holder receptacle 26 can be positioned on or above component side 34b and is configured to receive component holder 10. The orientation shown, wherein component holder 10 is above the array of lights 24, is only an example, and other relative positions can be used with lights 30 opposite the component holder 10 to shine thereon upon activation. In other embodiments, such as that shown in relevant part in FIG. 9, support 22 can include a frame 32 without any transmissive surface. Instead, a support 22' provides an aperture 35 sufficient to allow the light from lights 30 to reach component holder 10. In other embodiments, the light transmissive surface can be opaque and include a plurality of apertures registered with the plurality of lights to permit the lights to transmit light through the apertures to reach components 12 on component holder 10. The disclosed support structure 22 shown in FIGS. 2A, 2B and 9 are just examples, and any suitable structure that is sufficient to position a component holder 10 in a position opposite the array of lights 24, so that light can be directed to illuminate components 12 on component holder 10, can be used.

Figure 3:
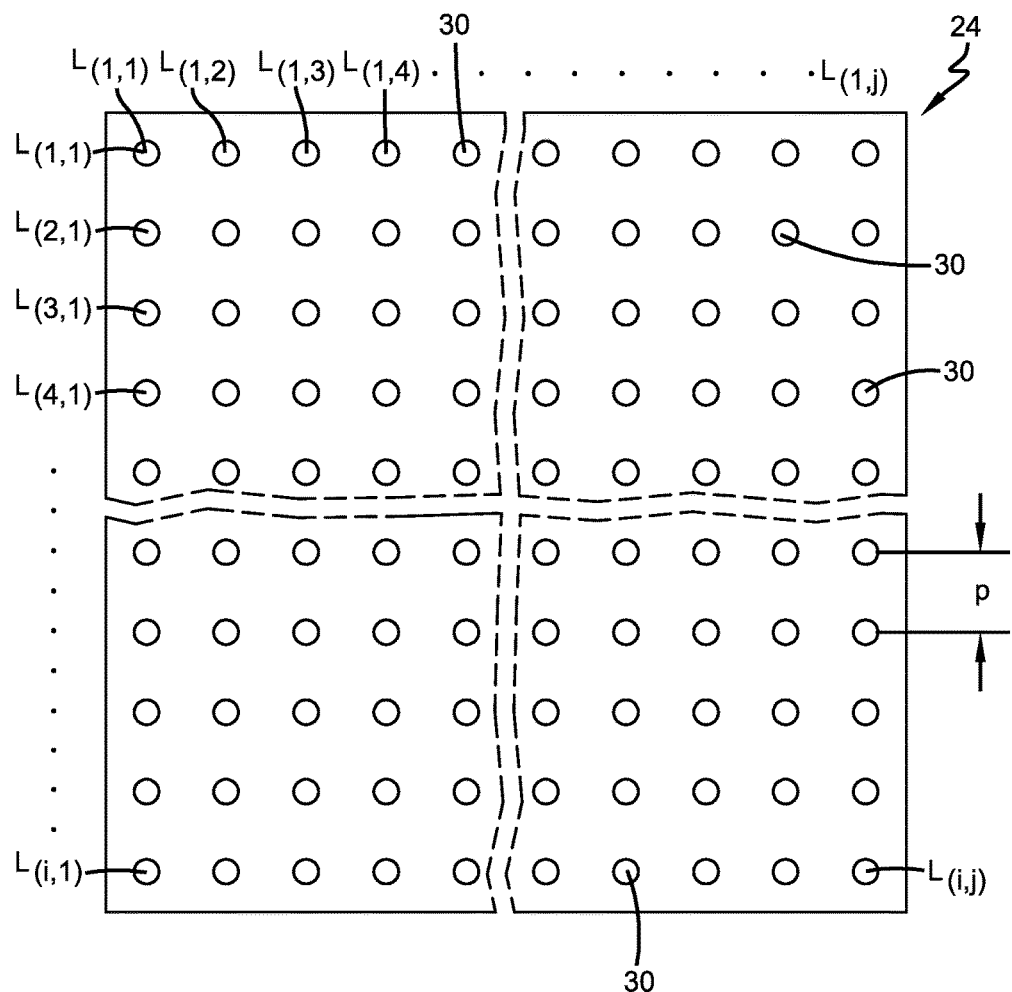
FIG. 3 shows an example of a two dimensional light array in accordance with some embodiments of the disclosed subject matter.

In some embodiments, as shown in FIG. 3, light array 24 comprises individual lights 30 organized in rows (1 to i) and columns (1 to j) in a two-dimensional array. It should be noted that differently arranged arrays can be employed. Individual lights 30 can be based on any type of suitable lighting technology, such as, light emitting diode (LED), organic light emitting diode (OLED), fluorescent, fiber optic, gas-plasma, cathode ray tube (CRT), liquid crystal display (LCD), laser, etc. In some embodiments, each light can be individually addressed by its row and column number, as represented by $L_{(i,j)}$. In further embodiments, the lights can be divided into sections (e.g., by row, column, quadrant, and/or any other suitable division) and each section can be addressable. Software, hardware and/or firmware (e.g., control module 28) can control each light or section by its address. Light array 24 can be comprised of lights that project monochromatic, different colors, and/or any combination thereof.

Figure 4:
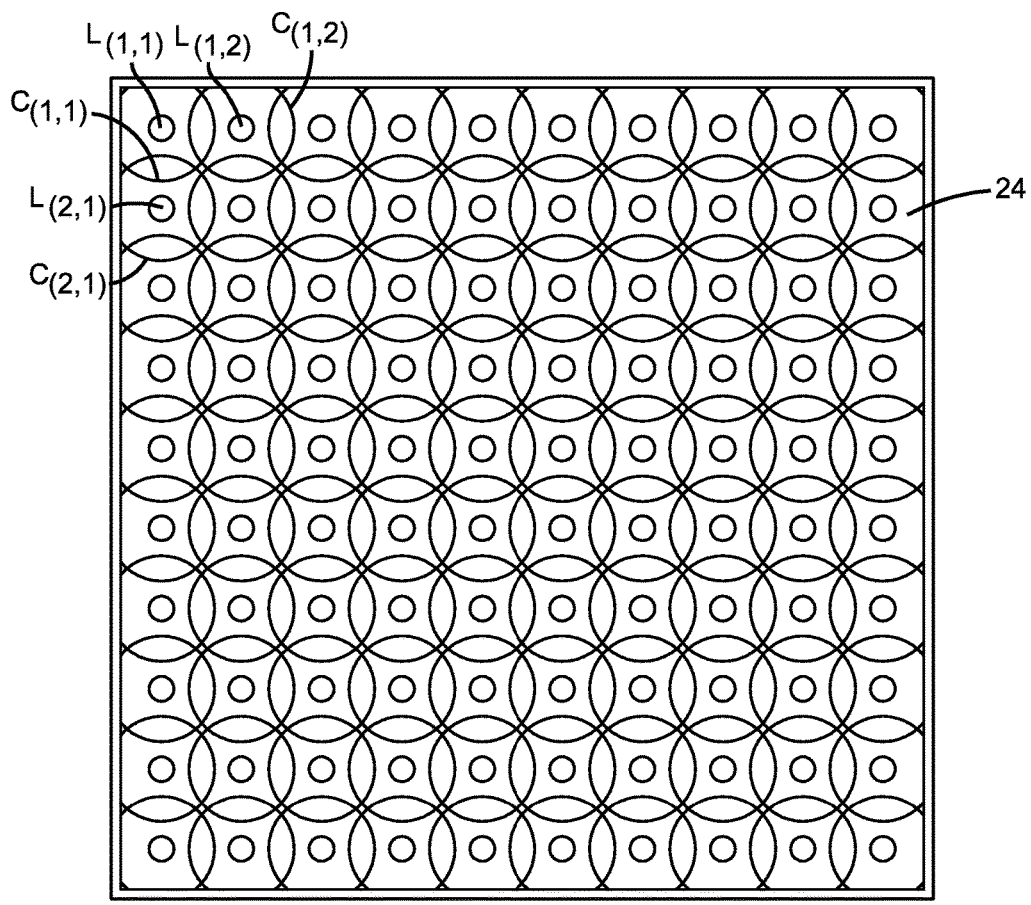
FIG. 4 shows an example of the area covered by the cone of lights projected by each light in the two dimensional light array in accordance with some embodiments of the disclosed subject matter.

FIG. 4 shows a cone of light $C_{(i,j)}$ emitted from each individual light $L_{(i,j)}$ and projected upwards towards the area where component holder 10 is placed on illumination apparatus 20. For each light, the area of illumination is intended to be employed to illuminate a component on a component holder. The magnitude of this area of illumination may vary from illuminating a portion of a component to encompassing the entire component. In other embodiments, for example, when the components are opaque, the area of illumination can surround the component completely or partially. The area of illumination can be calculated at different axial locations on or below component holder 10 (e.g., at the top of adhesive support 14 (as shown in FIG. 2A), at the bottom of adhesive support 14, at the top of components 12, at the top of transmissive surface 34, etc.) along the beam of light represented by the cones. The areas covered by each cone of light 30 can either be overlapping in part with the areas covered by the cone of light emitted from a neighboring light or not overlapping at all. In some embodiments, one or more focusing lenses and/or collimating lenses can be used to focus the area of each projected light to a region suitable for the components on a component holder.

Light array 24 can vary as to the number of lights, as represented by the number of rows and columns, the size of each individual light, the cone angle of each individual light (as shown in FIG. 3), the pitch (p) between lights and the distance (d) between the lights and the area where the light is projected (e.g., at the top of adhesive support 14 (as shown in FIG. 2A), at the bottom of adhesive support 14, at the top of components 12, at the top of transmissive surface 34, etc.). In some embodiments, the size of component holder 10, the number of components 12 on the holder, and/or the size of components 12 can determine the configuration of light array 24, including, for example, the arrangement of lights (whether in rows and columns or in other arrangements), the total number of lights, the distance (d), the cone angle and/or the pitch (p). In some embodiments, the distance, pitch, cone angle, size, and number of lights can be selected so that the area of illumination for each projected beam of the light (or the majority of the area) does not illuminate more than one component, when component holder 10 is retained in component holder receptacle 26. In this way, there is no confusion about which component 12 a given light 30 is intended to illuminate. In other embodiments, a projected beam of light can illuminate more than one component 12 when activated, but control module 28 can be configured to apply logic rules to determine which component 12 to assign to a light 30 that illuminates more than one component when activated. For example, if a light when activated illuminates 95% of component A and 20% of component B, then the light can be assigned to component A. Further, the arrangement of lights can be selected to make it obvious that, when a light is activated, even though some of the light extends to another component (e.g., 20% of component B), the light is intended to illuminate the component that is more fully illuminated (e.g., 95% of component A). Note, that any suitable assignment of lights 30 can be used with illuminating apparatus 20.

In some embodiments, as shown in FIG. 2B, component holder receptacle 26 can include a thin frame 26a having the same shape complementary to that of component holder 10 so as to readily receive component holder 10 and retain it in place without significant movement that could negatively affect accurate illumination of desired components 12. In some embodiments, where component holder 10 includes a frame 16, frame 26a can be made complementary to frame 16. Complementary in this context does not require identical shape, but rather appropriate dimensions and shape sufficient to hold component holder 10. Component holder receptacle 26 is just an example, and other types of structures can be used, such as one or more fasteners, a frame structure (as shown in FIGS. 2B, 9), a transparent or translucent plate, and/or any other suitable mounting structure. Component holder receptacle 26 can be designed so that when component holder 10 is placed therein, or attached thereto, components 12 on component holder 10 are aligned with lights 30 in light array 24. In some embodiments, components 12 are aligned so that the area of the projected illumination (or the majority of the area) from each light, when activated, does not illuminate more than one component 12.

Figure 1A:
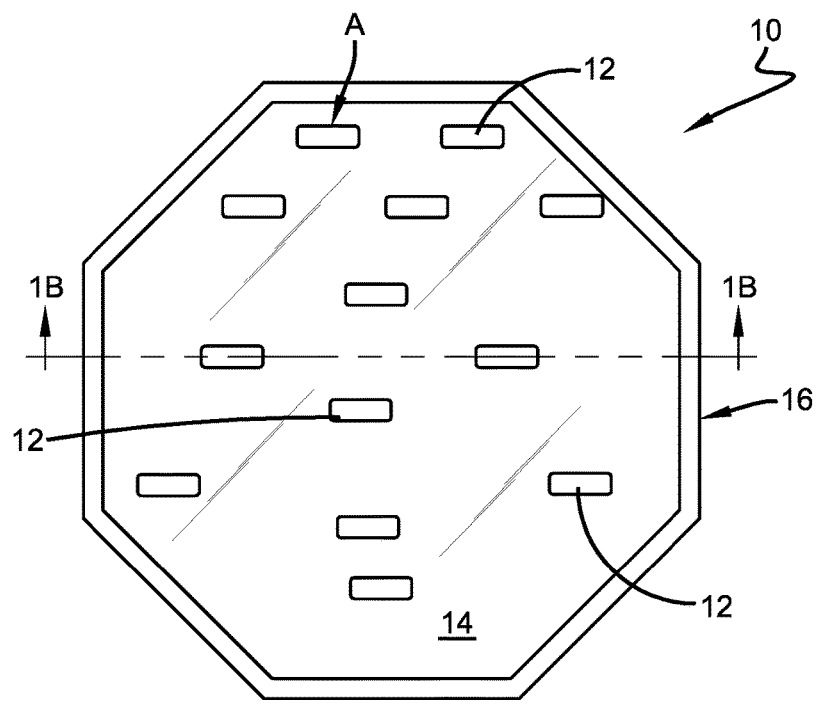
FIG. 1A is a top plan view of a schematic representation of an example component holder in accordance with some embodiments of the disclosed subject matter.
Figure 1B:
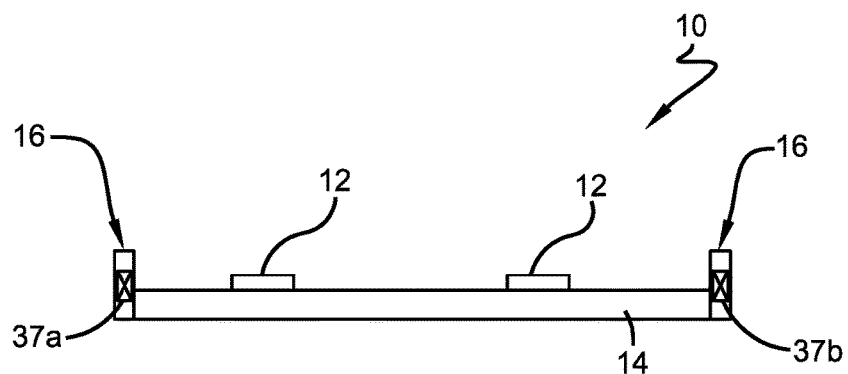
FIG. 1B is a cross section taken along the line 1B-1B of FIG. 1A, in accordance with some embodiments of the disclosed subject matter.

Illumination apparatus 20 can also include one or more reference points (e.g., 36a and 36b;) integrated into component holder receptacle 26 and/or frame 32 to detect the placement of and establish the orientation of component holder 10 having complementary reference points 37a, 37b. Locations of components 12 on component holder 26 can then be correlated to the location of lights 30 in light array 24 on support 22. By way of non-limiting example, the location of component A labeled in FIG. 1A can be determined in relation to reference point 37a and/or 37b on component holder 10. The locations of lights 30 and their areas of illumination can be determined relative to reference point 36a and/or 36b (FIG. 2A). Reference points as used herein can refer to reference points 36a, 36b, 37a, 37b and/or any other reference point used to locate lights 30 and/or components 12. When the component holder 10 is received in illumination apparatus 20, the relative positions of reference points 36a and/or 36b with one or more of reference points 37a and/or 37b can be used to calculate the location of component A relative to lights 30 of array of lights 24. More specifically, illumination apparatus 20 can be programmed to know the location of reference points 36a and/or 36b. Since reference points 37a, 37b, in some embodiments, are complementary to reference points 36a and/or 36b, illumination apparatus 20 can mathematically correlate location of components 12 in relation to reference points 37a, 37b to the location of lights in relation to reference points 36a, 36b.

Reference points 36a, 36b and complementary reference points 37a, 37b can include, for example, flats, notches, registering pins, sensors, etc. that mate or otherwise associate/communicate to establish a known orientation between component holder 10 and light array 24. The sensors can include, for example, optical, electrical, magnetic, proximity, infrared ultrasonic sensors, etc. In some embodiments, the reference points(s) can be used as reference points to determine the area of illumination of each light on component holder 10, as based on the location of a light in relation to reference points 36a, 36b, its cone angle, size, distance d, etc. The location of a light relative to the reference point(s) can be known, such that the cone angle, size, distance etc. can be used in a calculation that will define the area of illumination from the cone of light (as discussed in connection with FIG. 4). As used herein, the area of illumination can refer to the magnitude of the area covered and the location of that area on or below component holder 10 in relation to reference points 36a, 36b and/or any suitable reference point(s).

The illumination apparatus can be configured to receive location information regarding the location of components to be sorted. The location information can be conveyed by various means, for example, by an inspection apparatus or by a remote computer or memory device storing location information. The location information received can be correlated to the location of individual lights of light array 24 so that appropriate lights can be activated to illuminate components identified for sorting.

In other embodiments, illumination apparatus 20 can receive identification information (e.g., a unique identification number or name) identifying one or more components to be sorted. Illumination apparatus 20 can include a processor that can read the identification information (e.g., a serial number) and locate the component(s) to be sorted using the identification information. Once the component(s) to be sorted are located by illumination apparatus 20, illumination apparatus 20 can correlate the location of the identified component(s) with the location of individual lights of light array 24, so that the appropriate lights can be activated to illuminate components identified for sorting.

Figure 5:
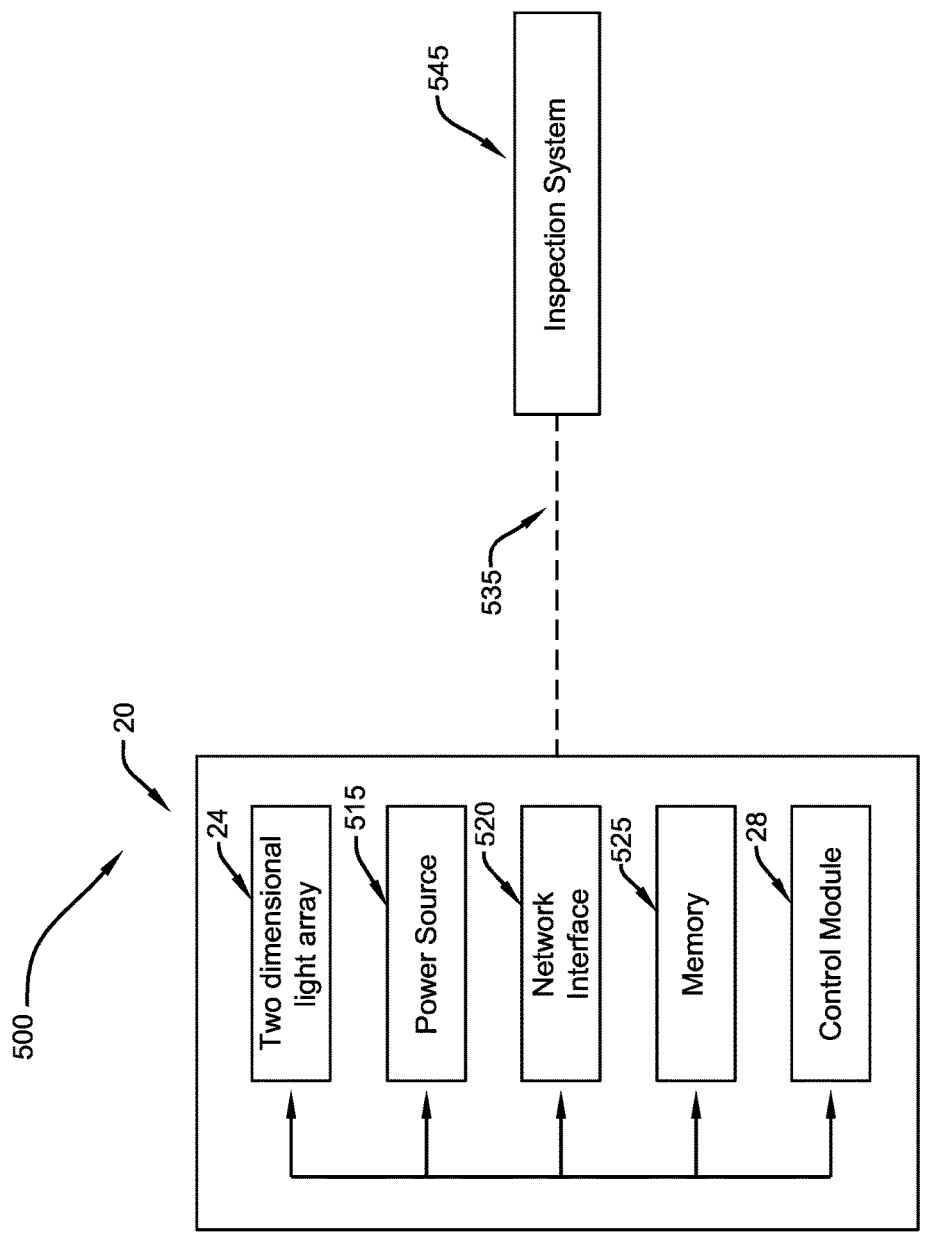
FIG. 5 shows a block diagram of an example illumination system in accordance with some embodiments of the disclosed subject matter.

With reference to FIG. 5, illumination apparatus 20 can be employed as part of an illumination system 500 including an inspection system 545 for inspecting components 12 on component holder 10. Inspection system 545 can be a microscope system or any other analytic system. Inspection system 545 can inspect and identify components 12 by their location on component holder 10 and/or by a unique identifier. In some embodiments, the location information (e.g., layout information detailing how components 12 are arranged on component holder 10) can be provided to inspection system 545. In other embodiments, the inspection system itself can generate the location information during inspection of component holder 10. The location information and/or other identifying information can then be conveyed to illumination apparatus 20, which can then illuminate the identified components for sorting. In further embodiments, inspection system 545 can also provide sorting information, which can be additional information conveyed to illumination apparatus 20 relating to sorting criteria used to identify components for sorting. Note, inspection system 545 can use the same reference point(s) (e.g. 37a and/or 37b) on component holder 10 as used by illumination apparatus 20 to align component holder 10 on inspection system 545 (e.g. microscope stage) and to identify components 12 on component holder 10 for sorting. By using common reference points, illumination apparatus 20 can use the location information provided by inspection system 545 to locate components identified for sorting on component holder 10. Otherwise, inspection system 545 can communicate the location of the reference point(s) that it used to identify components 12 for sorting to illumination apparatus 20, and illumination apparatus 20 can translate the location information provided by inspection system 545 to the reference points used by illumination apparatus 20 to locate lights 30.

By programming inspection system 545 to know the location of reference points 37a, 37b, the inspection system can further determine where a component 12 is located relative to those reference points upon inspection of the components in component holder 10. For example, in an inspection system including a microscope that analyzes components on a component holder on a translation stage, the inspection system can take into account the motion of the translation stage and magnification of the microscope's objective and know where the microscope is focused relative to reference points 37a, 37b. Inspection system 545 can record the location of each component it inspects and transmit this information to illumination apparatus 20. Illumination system 500 can thus obtain location data regarding all or only a select number of components, and retain such data to use in the choosing of lights for illumination of components selected for sorting. Other inspection apparatus (e.g., probes) can similarly be programmed to know the location of a component being analyzed relative to one or more reference points. The reference point on component holder 10 used by inspection system 545 can be communicated to illumination apparatus 20 and correlated to a reference point provided in illumination apparatus 20 when using the illumination apparatus to illuminate identified components for sorting.

FIG. 5 illustrates some of the electrical components, and the communication between them, of illumination system 500, in accordance with some embodiments of the disclosed subject matter. As shown in FIG. 5, light array 24 can be operatively connected to a power source 515 (e.g., an alternating current (AC) power source, a direct current (DC) power source, etc.) that provides power to illuminate light array 24.

Illumination apparatus 20 can include a network interface 520 for communicating over a network 535. Inspection system 545 can be operatively connected to network 535 and can communicate with illumination apparatus 20 and the individual components of illumination apparatus 20. The functionality of the components for illumination apparatus 20 can be combined into a single component or spread across several components. In some embodiments, the functionality of some of the components (e.g., controller, memory, power source) can be performed remotely from illumination apparatus 20.

Note that illumination system 500 can include other suitable components not shown. Additionally, or alternatively, some of the components included in illumination system 500 can be omitted. Further, the functionality of the components for illumination system 500 can be combined into a single component or spread across several components.

In some embodiments, control module 28, includes a controller and controller interface 40 to control settings, communications, operations and calculations performed by, and between, components of illumination apparatus 20. For example, control module 28 can process component location information, sorting information and other information received from inspection system 545; control module 28 can assign lights 30 to illuminate each component 12 on a component holder 10 and control the illumination and (in some embodiments) color of illumination of individual lights 30 of light array 24 to illuminate identified components 12. Control module 28 can include any suitable hardware (which can execute software in some embodiments), such as, for example, computers, microprocessors, microcontrollers, application specific integrated circuits (ASICs), field-programmable gate arrays (FGPAs), and digital signal processors (DSPs) (any of which can be referred to as a hardware processor), encoders, circuitry to read encoders, memory devices (including one or more EPROMS, one or more EEPROMs, dynamic random access memory ("DRAM"), static random access memory ("SRAM"), and/or flash memory), and/or any other suitable hardware elements.

Memory 525 can include any one or combination of volatile memory elements (e.g., random access memory (RAM, such as dynamic random access memory (DRAM), static random access memory (SRAM), etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory may incorporate electronic, magnetic, optical, and/or other types of storage media. Note that memory 525 can have a distributed architecture, where various components are situated remote from one another, but can be accessed by control module 28.

In some embodiments, communication 42 (as shown in FIGS. 2A and 2B) between control module 28 and the components of illumination apparatus 20 can use any suitable communication technologies, such as analog technologies (e.g., relay logic), digital technologies, (e.g., RS232, ethernet, or wireless), network technologies (e.g., local area network (LAN), a wide area network (WAN), the Internet) Bluetooth technologies, Near-field communication technologies, Secure RF technologies, and/or any other suitable communication technologies.

Illumination system 500 can be configured to operate in conjunction with inspection system 545. Inspection system 545 can communicate information (e.g., the location of the components on the component holder, the components identified for sorting, the criteria used for identifying the components for sorting, the reference points used to locate components 12 on component holder 10, etc.) to illumination apparatus 20 via network 535 and network interface 520.

The type of network utilized can include circuit switched, public-switched, packet switched, data, telephone, telecommunications, video distribution, cable, terrestrial, broadcast, satellite, broadband, corporate, global, national, regional, wide area, backbone, packet-switched. TCP/IP, Fast Ethernet, Token Ring, national, regional, wide area, public, Internet, private, ATM, multi-domain, and/or multi-zone subnetwork, one or more Internet service providers, and/or one or more information devices, such as a switch, router, and/or gateway not directly connected to a local area network, etc. Examples of networks can include a wide area network (WAN), a local area network (LAN), a Global System for Mobile Communications (GSM) network, a Code Division Multiple Access (CDMA) network, a Long Term Evolution (LTE) network and a Worldwide Interoperability for Microwave Access (WiMax) network.

Inspection system 545 can include any suitable type of microscope and/or other analytical tool useful for inspecting and/or identifying components for sorting. For example, in some embodiments, inspection system 545 can use an optical microscope that uses transmitted light or reflected light. More particularly, microscope system 545 can use the nSpec® optical microscope available from Nanotronics Imaging, Inc. of Cuyahoga Falls, Ohio.

Inspection system 545 can also include its own control module. Similar to control module 28, the control module can include a controller and controller interface to control settings, communications, operations and calculations performed by, and between, components of inspection system 25. The control module can include any suitable hardware (which can execute software in some embodiments), such as, for example, computers, microprocessors, microcontrollers, application specific integrated circuits (ASICs), field-programmable gate arrays (FGPAs), and digital signal processors (DSPs) (any of which can be referred to as a hardware processor), encoders, circuitry to read encoders, memory devices (including one or more EPROMS, one or more EEPROMS, dynamic random access memory ("DRAM"), static random access memory ("SRAM"), and/or flash memory), and/or any other suitable hardware elements.

Figure 6:
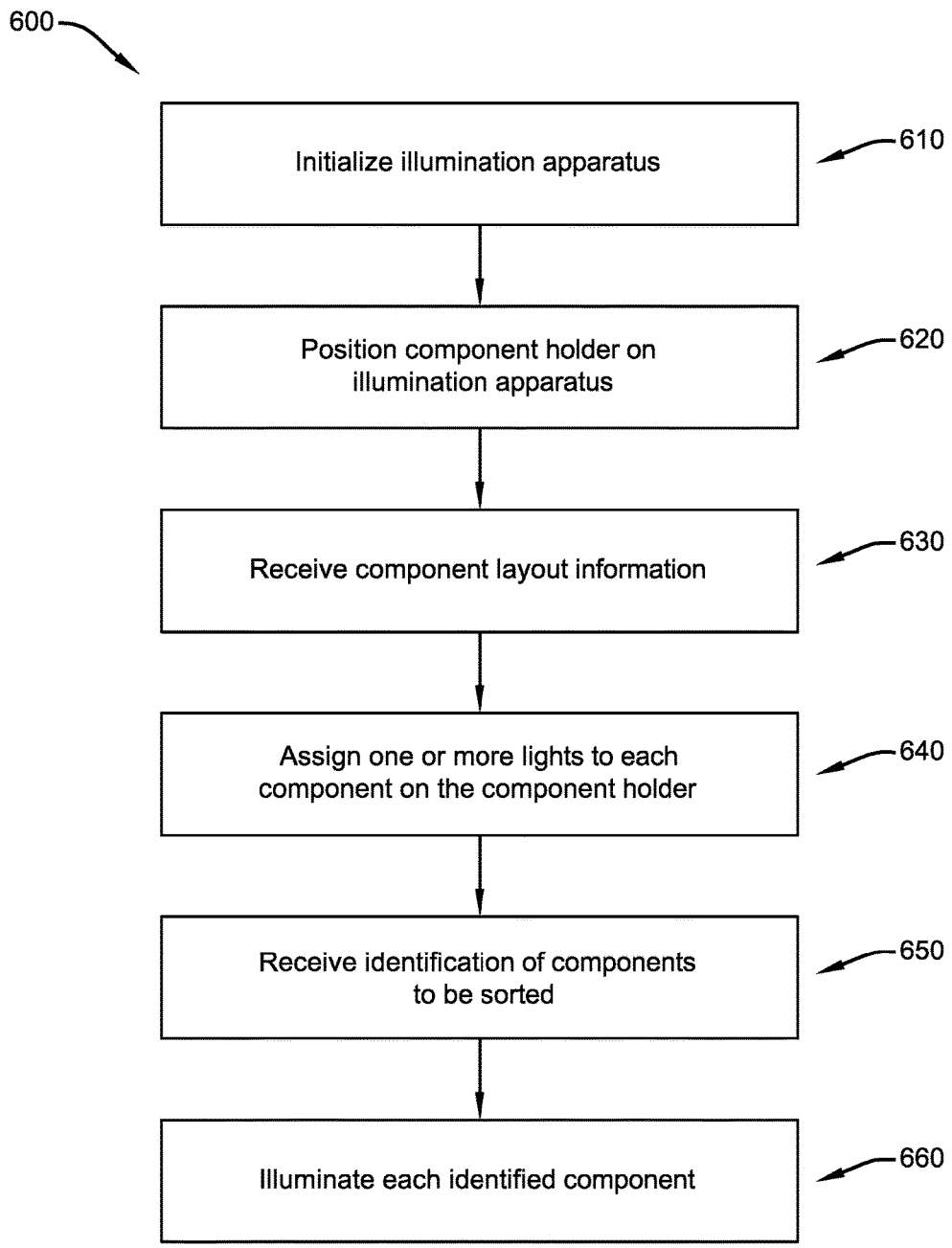
FIG. 6 shows an example of a flow chart of a process for illuminating certain components, using an illumination apparatus, such as the illumination apparatus illustrated in FIGS. 2A, 2B and 5, in accordance with some embodiments of the disclosed subject matter.

FIG. 6, shows an example process 600 for identifying certain components on a component holder through illumination, in accordance with some embodiments of the disclosed subject matter.

At 610, control module 28 can initialize illumination apparatus 20. In some embodiments, initialization can include determining the configuration of illumination apparatus 20 (e.g., the total number of lights in two-dimensional array 10, the address and location of each light 30, the cone angle for each light 30, the area of the projected beam for each light 30, and/or the distance of light 30 from the area where the component holder is placed) and storing the configuration information in local or remote memory.

Figure 7:
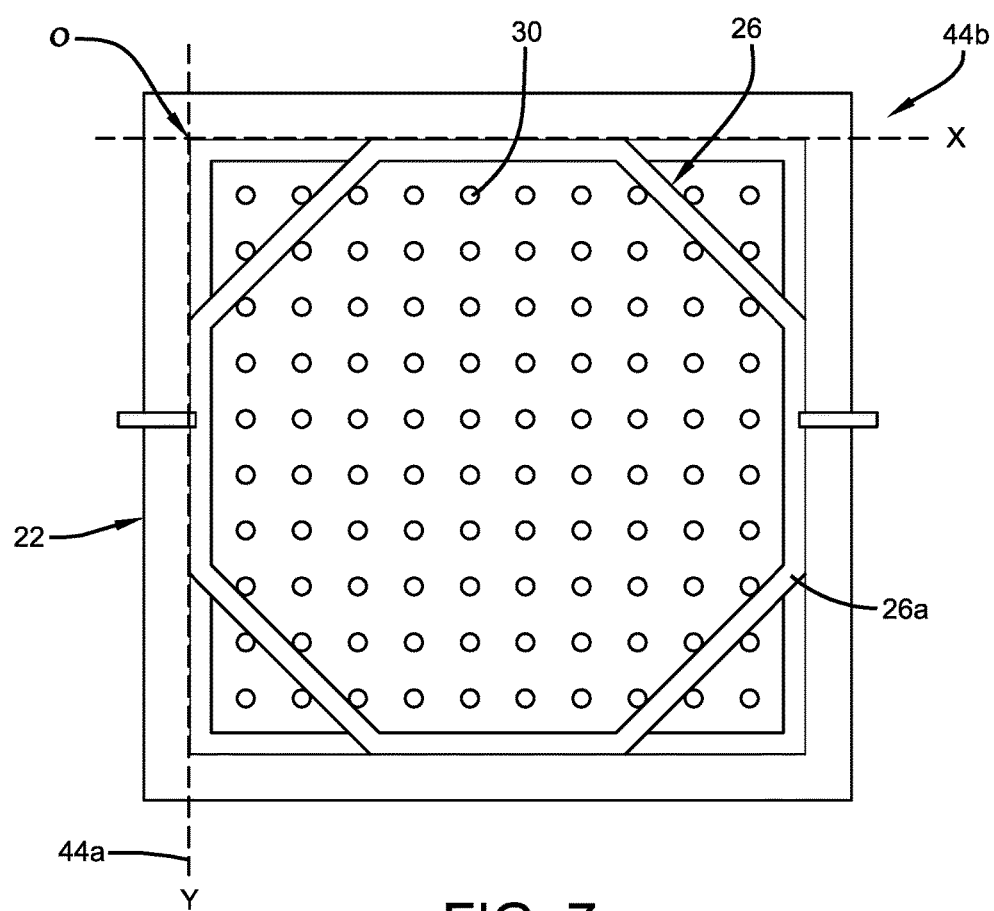
FIG. 7 is a top view of an example coordinate reference system for an illumination apparatus, in accordance with some embodiments of the disclosed subject matter.

In some embodiments, as shown for example in FIG. 7, a Cartesian XY coordinate system can be used to define the location of each light 30 in light array 24. The XY coordinate location of each light 30 represents a distance from coordinate axes 44a and 44b that meet at origin point (O). In some embodiments, the coordinate axes can be a pair of perpendicular lines that extend from two edges of component receptacle holder 26. Note that coordinate axes 44a and 44b and origin point O are just examples, the coordinate location of a component 12 can be measured from other coordinate axes and origin point O and/or from another reference point(s). In other embodiments, a light 30 can be located by: its polar coordinates in relation to an origin point; its quadrant location on light transmissive surface 34, a predefined location of the light on light transmissive surface 34 and/or any other suitable location. Based on the pitch of the lights, the cone angle of illumination and the distance from the light source to the region where the light is projected (e.g., at the top of adhesive support 14 (as shown in FIG. 2A), at the bottom of adhesive support 14, at the top of components 12, at the top of transmissive surface 34, etc.), the area of illumination projected by each light 30 can be calculated and stored for use by illumination apparatus 20 to illuminate components 12 identified for sorting. In some embodiments, the reference point(s) used by the illumination apparatus 20 to calculate the area of illumination projected by each light can be the same reference point(s) used by an inspection system 545 to identify coordinates of components 12 on component holder 10 for sorting.

For example, illumination apparatus 20 can be configured to locate or otherwise know the position of reference point 37a and/or 37b relative to lights 30, when component holder 10 is positioned in illumination apparatus 20. If the coordinates of the identified components 12 on component holder 10 are provided (e.g., by inspection system 545) to illumination apparatus 20 in relation to reference point 37a and/or 37b, illumination apparatus 20 can determine the appropriate light(s) to activate to illuminate the identified components 12.

At 620, component holder 10 can be positioned on, or attached to, component holder receptacle 26 of illumination apparatus 20. In some embodiments, reference point(s) (e.g., 36a, 37a and 36b, 37b) can be used to align component holder 10 on component holder receptacle 26. In some embodiment, component holder 10 can be manually aligned with light array 24.

At 630, control module 28 can receive component layout information from inspection system 545 identifying the location of each component 12 on component holder 10. In some embodiments, the component layout information can include each component's Cartesian XY coordinates in relation to an origin point. The origin point and coordinate axes that can be used to measure the coordinate locations of the components on the component holder can be in relation to a notch or a flat on the component holder (e.g., 37a and/or 37b), a reference component located on the component holder, and/or any other suitable reference point. Note, in some embodiments, a component's location can be identified by its polar coordinates in relation to an origin point; its quadrant location on component holder 10, a predefined location of the component on component holder 10 and/or any other suitable identification usable by control module 28 to identify lights 30 suitable for illuminating the components. In other embodiments, illumination apparatus 20 can include an imaging sensor that identifies the location of components 12 on component holder 20 when component holder 10 is placed in, or attached to, component holder receptacle 26. In some embodiments, the reference point(s) used to determine the location of components 12 on component holder 10, are the same reference point(s) used to calculate the area of illumination projected by each light, and/or the same reference point(s) used, by an inspection system 545, when identifying components 12 on component holder 10 for sorting. In some embodiments, control module 28 does not locate each component on component holder 10 in advance and only locates the components identified for sorting at 650.

At 640, control module 28 can assign one or more lights 30 to each component 12 on component holder 10. In some embodiments, the light assignment can be done manually by activating individually lights 30 of light array 24 and observing and recording which lights 30 illuminate which components 12. This can be useful when using illumination apparatus 20 to illuminate components on several component holders 10 that have the same configuration of components 12 thereon. In other embodiments, the light assignment can be calculated by illumination apparatus 20 as discussed above. In further embodiments, the light assignment can be determined by inspection system 545, such as an inspection system including a microscope with an illumination apparatus mounted to a stage. The lights in light array 24 can be sequentially or randomly illuminated one at a time, and inspection system 545 can use computer vision to identify which light or set of lights illuminate each component. This information can be recorded and used to generate the assignment of lights to components 12. Note, if the reference points used to calculate the area of illumination projected by each light 30 are different from the reference points used to locate the components on component holder 10, then control module 28 can translate the location of the components to the same reference points used to calculate the area of illumination, by using configuration information for light array 24 determined at step 610, the orientation of component holder 10 on component holder receptacle 26 and the component layout information determined at 630. Control module 28 can perform the translation before it assigns one or more lights to each component on the component holder.

Figure 10:
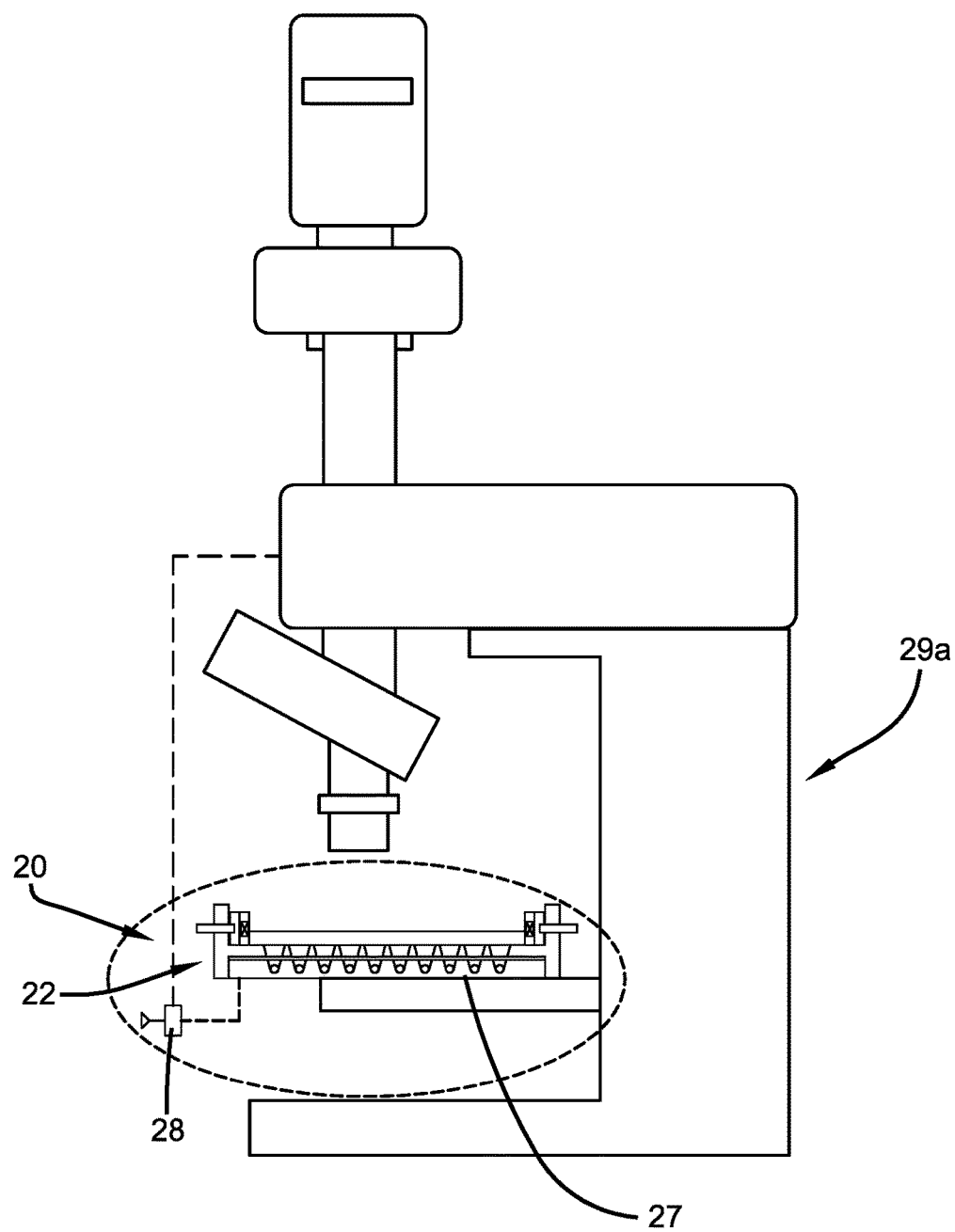
FIG. 10 shows an example illumination system employing a microscope system for inspection of components and an illumination apparatus for identifying components for sorting, in accordance with some embodiments of the disclosed subject matter.

In some embodiments, illumination apparatus 20 can be integrated into the stage and/or chuck of an inspection system, and illuminate components identified for sorting during inspection. For example, as seen in FIG. 10, support 22 as part of illumination apparatus 20 can be integrated into a translation stage 27 (or specimen chuck held thereby) of a microscope 29a. This system can inspect (via the inspection system) and illuminate components identified (via illumination apparatus 20) for sorting during inspection, in accordance with the disclosure herein.

In some embodiments, lights can be assigned to a component so that the area of illumination projected by the assigned lights, when activated, will illuminate only one component. In further embodiments, the lights can be assigned so that, when activated, the components are illuminated partially or completely. In some embodiments, if the area of the projected light will illuminate more than one component when it is activated, then the light can be assigned to the component that is closest to the center of the area of projection. Note, that other methods for assigning lights to each component can be used, as long as when a light is activated it is well-defined which component a light is illuminating. For example, a light, when activated, that illuminates 95% of component A and 20% of component B, can be assigned to component A. When the light is activated, even though 20% of component B will be illuminated, it is clear, since more of component A will be illuminated in comparison to component B, that the light is intended to identify component A.

In some embodiments, instead of assigning one or more lights to each component in advance of receiving information about components identified for sorting, control module 28 can first receive information about components identified for sorting, locate those components on component holder 10 and then assign appropriate lights to only those identified components (instead of each component).

At 650, illumination apparatus 20 receives information from inspection system 545 about components on component holder 10 that have been identified for sorting. In some embodiments, the received information can include location information for the identified components including the reference points that the location information is based on (e.g., the origin point and coordinate axes used to locate the identified components). The location information can be based on the same reference points used to determine the component layout information received and/or generated at 630, and/or used to calculate the area of illumination projected by each light. In other embodiments, illumination apparatus 20 can translate the location information generated by the methodology used to identify the components for sorting to the location information relevant to the methodology used by illumination apparatus 20 to calculate the area of illumination projected by each light on or below component holder 10 and thus select lights for illuminating components.

In further embodiments, sorting information, such as sorting criteria that indicates why a component has been identified for sorting, can be conveyed to illumination apparatus 20. Colors, blinking or other variations on illumination can be used to point out sorting criteria. Inspection system 545 can provide information to illumination apparatus 20 as to the type of light to employ (such as color, blinking or other variation) to illuminate each identified component to indicate sorting criteria.

At 660, control module 28 can drive the light(s) associated with each identified component to illuminate the identified component(s). Each identified component can be illuminated one by one, all at once, or any other combination.

Figure 8:
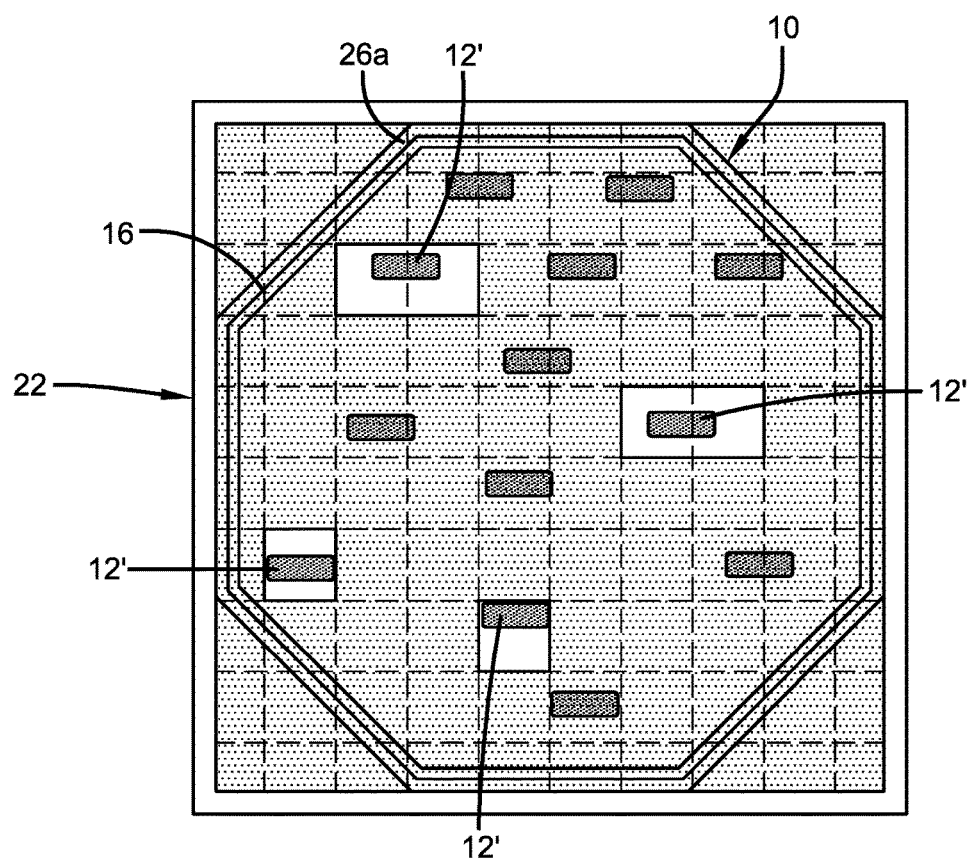
FIG. 8 shows the illumination of several components using an illumination apparatus, such as the illumination apparatus illustrated in FIGS. 2A, 2B and 5, in accordance with some embodiments of the disclosed subject matter.

FIG. 8 shows an example embodiment of component holder 10 on illumination apparatus 20, where identified components 12' are illuminated, in accordance with some embodiments of the subject disclosure. Also shown in FIG. 8, are squares formed by grid lines. Each square represents an area of illumination projected by a light when a light is activated. In some embodiments, the number of lights that can be activated for a component correspond to the illumination area taken up by a component. For example, for an identified component that spans an area of illumination projected by two lights, two corresponding lights can be activated. In other embodiments, a number of lights that project an illumination area less than the total area taken up by an identified component can be illuminated, as long as the number of lights activated is sufficient to locate the identified component on component holder 10.

In some embodiments, as shown in FIG. 8, component holder 10 can be transparent or translucent and the components can be opaque. In other embodiments, the component holder can be opaque and the components can be transparent or translucent. In further embodiments, both the component holder and the components can be transparent or translucent.

In some embodiments, light array 24 can be comprised of lights that project different colors. The different colors can be used by illuminator apparatus 20 to reflect different sorting criteria for components 12 identified for sorting on component holder 10. Based on the number of criteria used to inspect components 12 on component holder 10, control module 28 and/or inspection system 545 can assign a color to each criterion. Control module 28 can then activate the relevant lights, and, in some embodiments, control the color of the lights to indicate the components identified for sorting based on a particular criterion. For example, components on a component holder can be inspected and can be identified as "pass," "unfit for commercial use" or "needs further inspection." In some embodiments, control module 28 and/or inspection system 545 can assign: the color green to "pass" and control module 28 can illuminate in green all the components that have been identified as "pass;" the color red to "unfit for commercial use" and control module 28 can illuminate in red all the components that have been identified as "unfit for commercial use;" and the color yellow to "needs further inspection" and control module 28 can illuminate in yellow all the components that have been identified as "needs further inspection."

The division of when the particular portions of process 600 are performed can vary, and no division or a different division is within the scope of the subject matter disclosed herein. Note that, in some embodiments, blocks of process 600 can be performed at any suitable times. It should be understood that at least some of the portions of process 600 described herein can be performed in any order or sequence not limited to the order and sequence shown in and described in the FIG. 6 in some embodiments. Also, some of the portions of process 600 described herein can be or performed substantially simultaneously where appropriate or in parallel in some embodiments. Additionally or alternatively, some portions of process 600 can be omitted in some embodiments.

Process 600 can be implemented in any suitable hardware and/or software. For example, in some embodiments, process 600 can be implemented in control module 28.

The provision of the examples described herein (as well as clauses phrased as "such as," "e.g.," "including," and the like) should not be interpreted as limiting the claimed subject matter to the specific examples; rather, the examples are intended to illustrate only some of many possible aspects. It should also be noted that, as used herein, the term mechanism can encompass hardware, software, firmware, or any suitable combination thereof.

Unless specifically stated otherwise as apparent from the above discussion, it is appreciated that throughout the description, discussions utilizing terms such as "determining," "displaying," or the like, refer to the action and processes of a computer, or similar electronic computing device, that manipulates and transforms data represented as physical (electronic) quantities within the computer memories or registers or other such information storage, transmission or display devices.

Certain aspects of the present disclosure include process steps and instructions described herein in the form of an algorithm. It should be noted that the process steps and instructions of the present disclosure could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of non-transient computer-readable storage medium suitable for storing electronic instructions. Furthermore, the computers referred to in the specification may include a single processor or may be architectures employing multiple processor designs for increased computing capability.

The algorithms and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein, and any references to specific languages are provided for disclosure of enablement and best mode of the present disclosure.

The illumination apparatus, method and system have been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure. The scope of the invention is limited only by the claims that follow.

What is claimed is:

1. An illumination apparatus, comprising:
    an array of lights;
    a component holder receptacle configured to receive a component holder having components thereon;
    a control module configured to:
        receive information about one or more components on the component holder, the information including at least one of identification of one or more components for sorting and location information for locating the one or more components on the component holder; and
        selectively control activation of individual lights of the array of lights to illuminate the one or more components; and at least one reference point configured to interact with at least one reference point on a component holder, when a component holder is placed in the component holder receptacle.

2. The illumination apparatus of claim 1, wherein the location information is based on one or more reference points used by an inspection system to identify the one or more components and used by the illumination apparatus to assign the individual lights of the array of lights to illuminate the one or more components.

3. The illumination apparatus of claim 1 wherein at least two components are identified for sorting based on different criteria and the control module is configured to activate the lights in different colors to reflect the different sorting criteria.

4. The illumination apparatus of claim 1, further comprising a frame surrounding a light transmissive surface, wherein the array of lights and the component holder receptacle are positioned at opposite sides of the light transmissive surface.

5. The illumination apparatus of claim 4, wherein the at least one reference point of the illumination apparatus is provided in the frame.

6. The illumination apparatus of claim 1, wherein the control module is configured to control the selective illumination based on the interaction of the at least one reference point on the support and the at least one reference point on the component holder, when a component holder is placed in the component holder receptacle.

7. The illumination apparatus of claim 1, wherein the control module is configured to calculate the area of illumination projected by one or more of the lights of the array of lights on or below the component holder, when the component holder is placed in the component holder receptacle, and to control the selective illumination based on the calculated area of illumination.

8. The illumination apparatus of claim 7, further comprising at least one reference point, wherein the control module is configured to calculate the area of illumination based on the reference point.

9. An illumination system comprising:
an illumination apparatus comprising:
   an array of lights;
   a component holder receptacle configured to hold a component holder having components thereon; and
   at least one reference point configured to interact with at least one reference point on a component holder, when a component holder is placed in the component holder receptacle;
an inspection system configured to generate component information about one or more components on the component holder, the component information including at least one of identification of one or more components for sorting and location information for locating the one or more components on the component holder; and
a control module configured to receive the component information and activate one or more lights of the array of lights to illuminate at least a portion of the one or more components identified for sorting on the component holder.

10. The illumination system of claim 9, wherein the illumination apparatus further includes a frame surrounding a light transmissive surface, wherein the array of lights and the component holder receptacle are positioned at opposite sides of the light transmissive surface.

11. The illumination system of claim 10, wherein the at least one reference point of the illumination apparatus is provided in the frame.

12. The illumination system of claim 11, wherein the control module is further configured to control the activation of one or more lights based on the relative positions of the at least one reference point on the support and the at least one reference point on the component holder, when the component holder is placed in the component holder receptacle.

13. The illumination system of claim 12, wherein the inspection system generates the location information based on the at least one reference point on the component holder.

14. The illumination system of claim 9, wherein each light of the array of lights is not assigned to more than one component on the component holder.

15. A method for sorting components on a component holder, the method comprising:
receiving, by an illumination apparatus, information about one or more components on a component holder, the information including at least one of identification of the one or more components identified for sorting and location information for locating the one or more components on the component holder, wherein the illumination apparatus comprises:
   an array of lights;
   a component holder receptacle configured to receive the component holder; and
   a control module configured to selectively control illumination of individual lights of the array of lights; and
   at least one reference point configured to interact with at least one reference point on a component holder, when a component holder is placed in the component holder receptacle positioning the component holder in the component holder receptacle; and
selectively activating, by the control module, one or more individual lights of the array of lights to illuminate the one or more components identified to be sorted, wherein said at least one reference point is employed by the illumination apparatus to accurately illuminate the one or more components in said step of selectively activating.

16. The method of claim 15, further comprising:
generating, by an inspection system, the received information; and
transmitting the received information to the illumination apparatus.

17. The method of claim 16, further comprising:
assigning one or more lights of the array of lights to at least one component on the component holder placed in the component holder receptacle, wherein the assigned light illuminates, when it is activated, at least a portion of the component to which it is assigned.

18. The method of claim 17, wherein each light of the array of lights is not assigned to more than one of the components on the component holder.

19. The method of claim 17, wherein the step of assigning is performed by at least one of manually, by the control module and by the inspection system.

20. The method of claim 15, wherein the location information is based on the at least one reference point on the component holder.

21. The method of claim 20, wherein the control module controls the selective illumination based on the interaction of the at least one reference point on the illumination apparatus and the at least one reference point on the component holder.

22. The method of claim 15, wherein selectively activating further comprises activating the lights in different colors to reflect different sorting criteria when illuminating the one or more of the components.

* * * * *